United States Patent [19]

Yamamoto et al.

[11] 3,980,974
[45] Sept. 14, 1976

[54] COMPACT, WAVEGUIDE-TYPE MICROWAVE TRANSMIT-RECEIVE APPARATUS

[75] Inventors: Sadamu Yamamoto, Yokohama; Michio Kashiwagi, Tokyo; Koichi Nishio, Sagamihara; Kunio Akada, Yokohama, all of Japan

[73] Assignee: Tokyo Shibaura Electric Co., Ltd., Kawasaki, Japan

[22] Filed: Mar. 31, 1975

[21] Appl. No.: 563,827

[30] Foreign Application Priority Data
Apr. 1, 1974 Japan............................. 49-35616

[52] U.S. Cl................................ 333/33; 325/24; 331/96; 331/107 G; 333/98 R; 343/8
[51] Int. Cl.² ...................... H01P 1/20; G01S 9/44
[58] Field of Search............. 333/7 D, 33, 35, 98 R; 343/8, 113 DE, 5 PD; 331/96, 107 G; 325/445, 23, 24; 321/69 W

[56] References Cited
UNITED STATES PATENTS 3,611,374  10/1971  Draysey ............................ 343/8 X
3,711,792  1/1973   Kaneko et al. ............... 331/107 G X
3,737,802  6/1973   Kawakami ................... 331/107 G X Primary Examiner—Paul L. Gensler
Attorney, Agent, or Firm—Oblon, Fisher, Spivak, McClelland & Maier

[57] ABSTRACT

A microwave transmitting and receiving apparatus comprises a Gunn diode as an oscillating element and a mixer diode as a receiving element disposed within a rectangular waveguide closed at one end by its short-circuiting plate. The oscillating and receiving elements are juxtaposed with each other at a position spaced by ½ λg (λg: wavelength in the waveguide) from the short-circuiting plate toward an opening of the waveguide. An adjusting screw for permitting a match of the receiving element impedance with the input signal impedance and for adjusting the output power is fitted by screw engagement to the waveguide at a position spaced by ¼ λg from a straight line connecting the both elements toward the waveguide opening, and another adjusting screw for oscillating frequency-adjustment is fitted by screw engagement to the waveguide at a position between said straight line and the short-circuiting plate.

11 Claims, 10 Drawing Figures

COMPACT, WAVEGUIDE-TYPE MICROWAVE TRANSMIT-RECEIVE APPARATUS

This invention relates to a waveguide-type microwave transmitting and receiving apparatus.

In the conventional microwave transmitting and receiving apparatus as a microwave Doppler radar, the microwaves generated from a Gunn diode are for the most part radiated from an antenna to the exterior through a circulator, and are partially passed through a directional coupler and sent to a mixer diode to excite the same. The microwave signal reflected from a substance to be detected is entered from the antenna into the mixer diode through the circulator. From this mixer diode there is obtained a Doppler signal whose frequency is determined by said reflected microwave signal and said partial microwave signal. The microwave transmitting and receiving apparatus having the foregoing construction indeed has a relatively high sensitivity, but is made complicated in construction and therefore made bulky as a whole.

The object of the invention is to provide a compact microwave transmitting and receiving apparatus which is high in sensitivity and simple in construction.

According to the invention, there is employed a waveguide having one end closed by its short-circuiting plate, and oscillating and receiving elements are juxtaposed with each other at those positions within said waveguide which are spaced from said short-circuiting plate by a distance equal to either one of ½ λg (λg: wavelength in the waveguide) and an integral multiple of said ½ λg. Further, an oscillating frequency adjusting screw is fitted by screw engagement to the waveguide at a position between the short-circuiting plate and a straight line connecting said both elements.

This invention can be more fully understood from the following detailed description when taken in conjunction with the accompanying drawings, in which.

Figure 7:
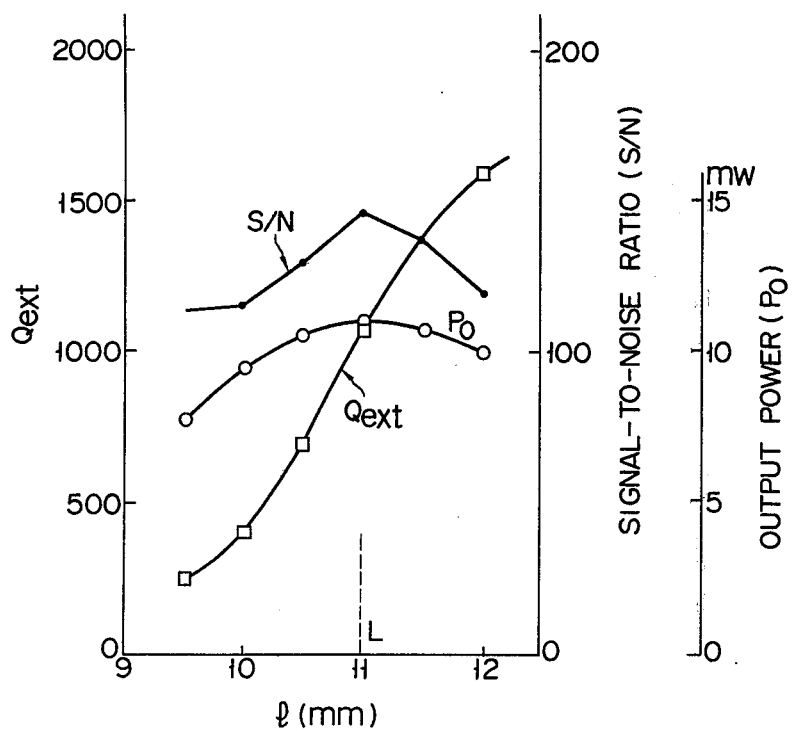
Figure 8:
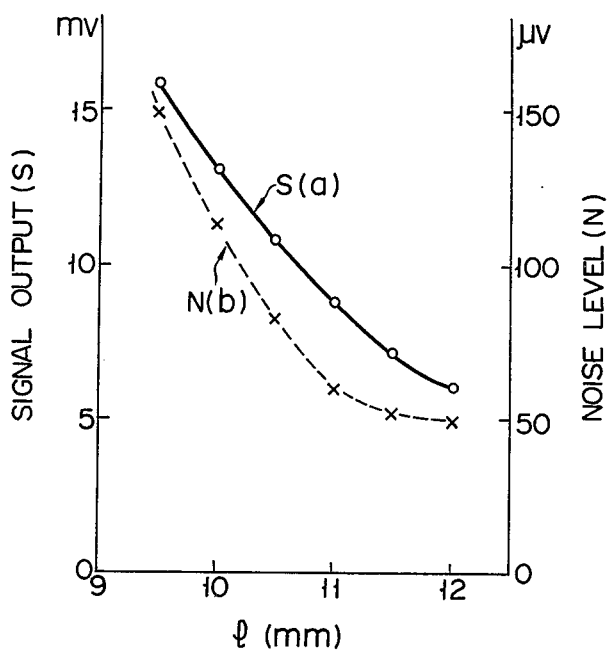
Figure 9:
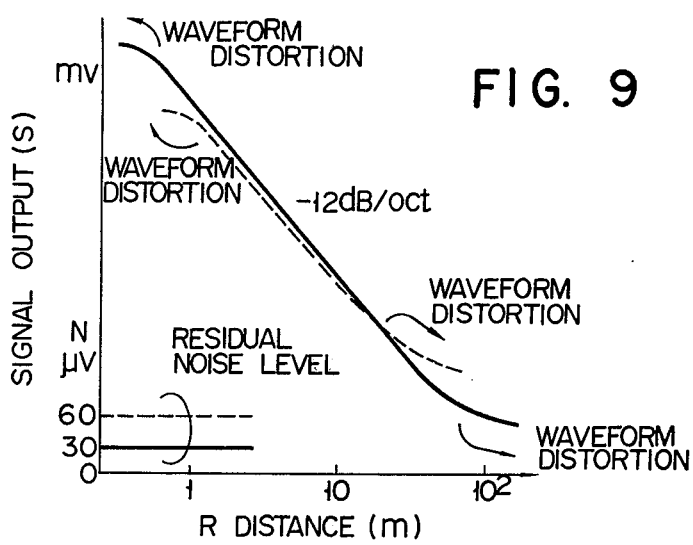
Figure 10:
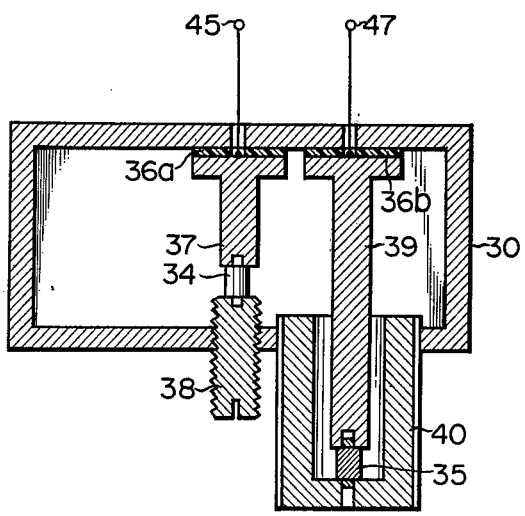

FIG. 7 graphically shows the relations between the length of the coaxial line body and each of the external Q, the S/N ratio and the output power of the apparatus;

FIG. 8 graphically shows the relations between the length of the coaxial line body and each of the receiving sensitivity S and the noise level N of the apparatus;

FIG. 9 graphically shows the relations of the distance R between a substance to be detected and the apparatus with each of the receiving signal S and the residual noise level N of the apparatus; and FIG. 10 shows a microwave transmitting and receiving apparatus according to another embodiment of the invention in which the oscillating element is disposed on the substantially central axis of the top wall (H plane) of the waveguide.

Figure 1:
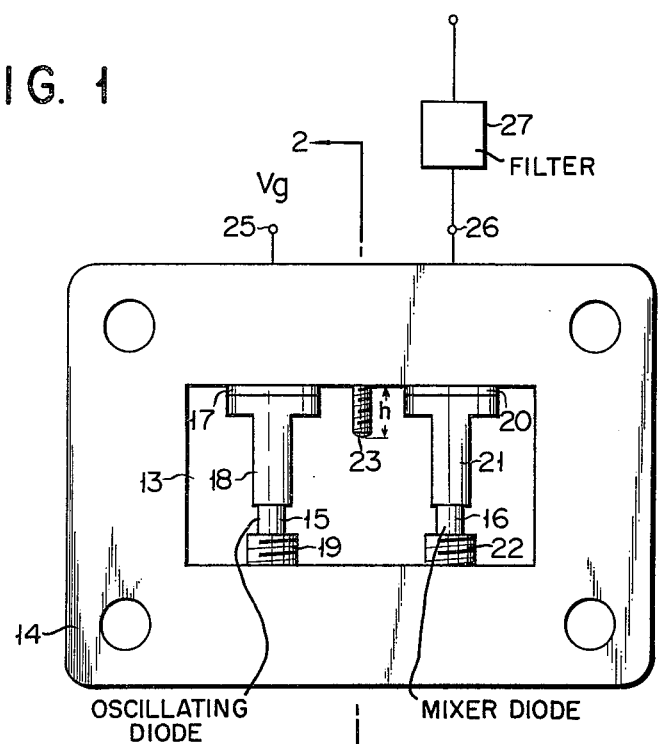
FIG. 1 is a plan view of a microwave transmitting and receiving apparatus according to an embodiment of the invention.
Figure 2:
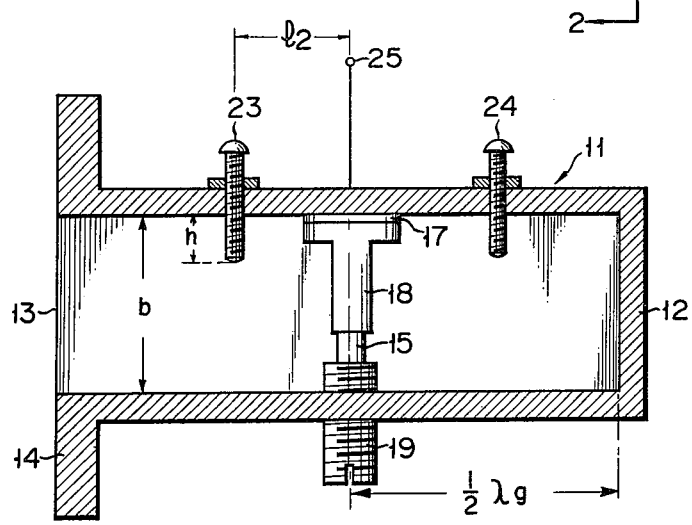
FIG. 2 is a longitudinal sectional view taken along the line 2—2 of FIG. 1.

In a microwave transmitting and receiving apparatus illustrated in FIGS. 1 and 2, one end of a rectangular waveguide 11 is closed by a short-circuiting plate 12, while the other end thereof is opened to constitute an opening portion 13 and is provided with an attaching flange 14 connected to, for example, a horn antenna for transmitting and receiving the microwave. At those positions within the waveguide 11 which are at a distance of ½ λg (λg: wavelength in the waveguide) from the inner surface of the short-circuiting plate 12 toward the opening portion 13 an oscillating element, for example, a Gunn diode 15 and a receiving element, for example, a mixer diode 16 are juxtaposed with each other so as to be rendered equidistant from the center axis of the lateral width of the waveguide. The Gunn diode 15 is fixedly sandwiched between a stationary screw 19 and a conductive holding post 18 allowed to abut against the top wall of the waveguide through an insulating sheet 17 such as a Teflon sheet. Similarly, the mixer diode 16 is fixedly sandwiched between a stationary screw 22 and a conductive holding post 21 allowed to abut against the top wall of the waveguide through an insulating sheet 20 such as a Teflon sheet. Further, at that portion of said top wall which is at a distance ($l_2$) of ¼ λg from the diodes 15, 16 toward the opening portion 13 an adjusting screw 23 is fitted by screw engagement to the top wall of the waveguide 11 in a manner penetrating therethrough, while at that prescribed portion of the top wall between the short-circuiting plate 12 and the diodes 15, 16 an oscillating frequency adjusting screw 24 is fitted by screw engagement to the top wall of the waveguide 11 in a manner penetrating therethrough.

When, in the foregoing microwave transmitting and receiving apparatus, an operating voltage is applied to the Gunn diode 15 through a lead wire 25 and the conductive post 18, microwaves are generated at a frequency determined by a waveguide resonating circuit formed between the Gunn diode 15 and the shot-circuiting plate 12. Part of this microwave output is applied directly to the mixer diode 16 juxtaposed with the Gunn diode 15, and the remaining is for the most part radiated to the exterior through the opening portion 13 and is reflected from a substance desired to be detected and is applied to the mixer diode 16. As a result, a mixed frequency signal of the directly applied microwave and the reflected microwave is produced from the mixer diode 16. This mixed frequency signal is supplied to a filter 27 via the terminal 26, and a Doppler signal having a difference frequency between said directly applied microwave and the reflected microwave is drawn out from the filter 27. This Doppler signal is used to make operative, for example, an automatic door, a burglary alarm device, or a car-collision preventing device.

The distance between the center axis of the waveguide and the Gunn diode 15 or mixer diode 16 is determined so that an excessive amount of exciting power is prevented from entering the mixer diode and so that the mixer diode has a maximum receiving sensitivity to the frequency of an input signal reflected from said detection substance.

Figure 3:
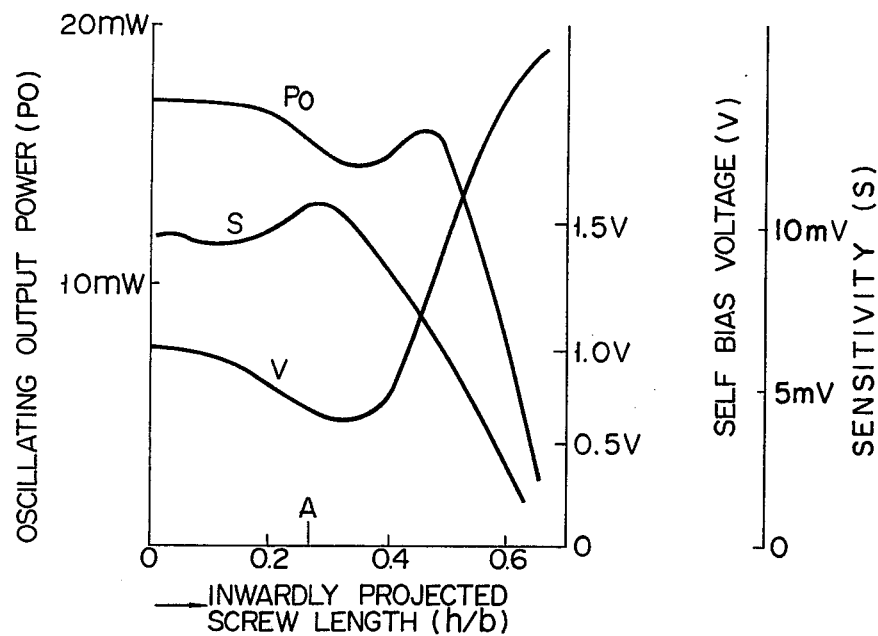
FIG. 3 is a curve diagram illustrating the characteristic of the microwave transmitting and receiving apparatus of the invention.

The adjusting screw 23 is provided for the purpose of causing a match of the mixer diode 16 with the input signal supplied thereto and adjusting the output power of an output signal sent out from the opening portion 13. Where the length $h$ of the inwardly projected portion of the adjusting screw 23 is varied in the width direction of the side wall of the waveguide, the output power ($P_0$), the receiving sensitivity (S) and the selfbias voltage (V) applied to the mixer diode are varied correspondingly as illustrated in FIG. 3. Accordingly, through adjusting the length of the inwardly projected portion of the adjusting screw 23 the apparatus can be set at a point where the apparatus has a maximum receiving sensitivity, relatively large output power, substantially minimum selfbias voltage and high ratio of the receiving sensitivity S to the residual noise signal level N, such as at a point A in FIG. 3. Further, even when in the mass-production of the apparatus the characteristic of the Gunn diode and mixer diode presents a variation, provision of the adjusting screw makes it easy to adjust the individual finished products to a maximum characteristic state, enabling them to be uniformly enhanced in quality. Further, the apparatus can be composed of a short-measured waveguide whose entire length is 1 wavelength or less, and therefore can be miniaturized. Further, since the mixer diode faces said detecting substance as a load and constitutes part of the resonating circuit, the input signal from the exterior to the apparatus is effectively detected by the mixer diode and simultaneously a variation in the operative condition of the oscillation due to the input signal is detected in the form of a signal by the mixer diode. As a result, this detected signal is added to said detected output to increase the receiving sensitivity of the apparatus. Further, since, in the preceding embodiment, the mixer diode is disposed deviated crosswise from the center axis of the waveguide, the absolute waveguide impedance decreases to cause a match with the low impedance of the mixer diode. As a result, the receiving sensitivity of the apparatus is increased. Conventionally, however, in the case of causing a match of the waveguide impedance with the diode impedance, there has been employed a reduced height waveguide whose E plane is made small and within which diodes are disposed. But in such an apparatus as having this type of waveguide, the Q of the resonating circuit involved therein is decreased. In contrast, the apparatus according to the invention permits a match of the aforesaid impedances through adjusting the position at which the diodes are to be disposed, which enables a manufacture with ease of an apparatus having a higher value of Q.

Figure 4:
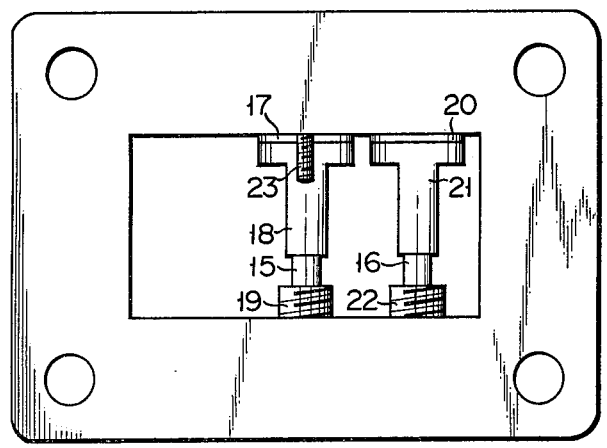
FIG. 4 is a plan view of a modification of the microwave transmitting and receiving apparatus illustrated in FIG. 1.

In the preceding embodiment, the Gunn diode and the mixer diode are disposed equidistantly from the center axis of the waveguide, the but Gunn diode may be disposed on the center axis of the waveguide as illustrated in FIG. 4.

In the preceding embodiment, the length of the resonating circuit involved in the rectangular waveguide, that is, the distance between the short-circuiting plate and the diodes is set at ½ $\lambda g$, but in the case where the oscillating frequency is high, this length can be set at a value equal to an integral multiple of the ½ $\lambda g$.

There will now be described another embodiment of the invention further improved in the above-mentioned embodiment.

Figure 5:
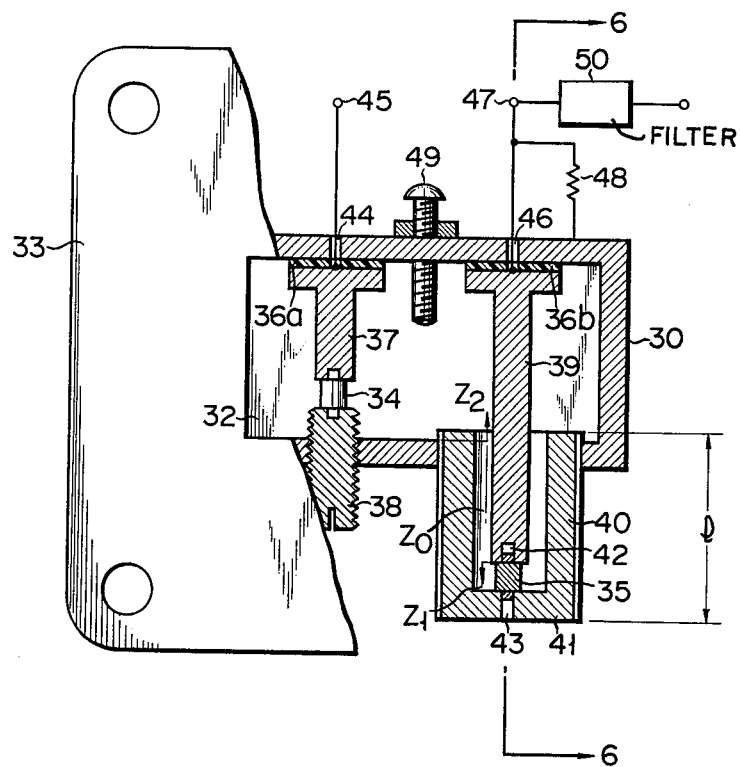
FIG. 5 is a front view, partly in cross section, of a microwave transmitting and receiving apparatus according to another embodiment of the invention, in which a coaxial line body is provided for the receiving element unit.
Figure 6:
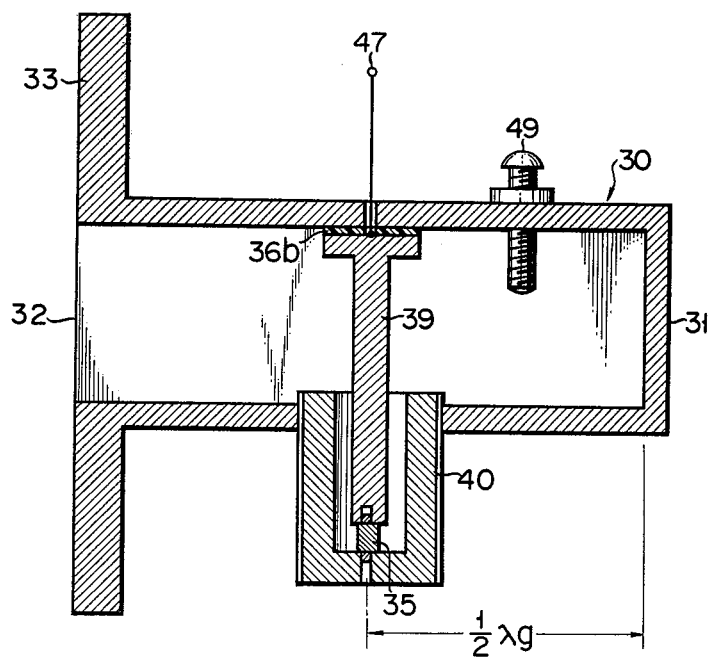
FIG. 6 is a longitudinal sectional view taken along the line 6—6 of FIG. 5.

As illustrated in FIGS. 5 and 6, one end of a rectangular waveguide 30 is closed by a short-circuiting plate 31 while the other end thereof is opened to constitute an opening portion 32 and is formed with an attaching flange 33, said waveguide 30 being formed of a diecasted alumina. At those positions of the waveguide 30 which are at a distance of ½ $\lambda g$ from the inner surface of the short-circuiting plate 31 toward the opening portion 32, a Gunn diode 34 and a mixer diode 35 are disposed equidistantly from the center axis of the waveguide. The Gunn diode 34 is fixedly sandwiched between one end of a brass-made post 37 disposed at a position spaced by a prescribed distance from the center axis of the waveguide toward one side wall of the waveguide and a stationary screw 38 opposed to the post 37 and fitted through the illustrated bottom wall of the waveguide 30, the other end of said post 37 abutting against the inner surface of the illustrated top wall of the waveguide 30 through an insulating sheet 36a. The mixer diode 35 is fixedly disposed between one end of a brass-made post 39 disposed at a position spaced by said prescribed distance from the center axis of the waveguide toward the other side wall of the waveguide and a short-circuiting plate 41 of a coaxial line body 40 which is fitted by screw engagement through the bottom wall of the waveguide so as to oppose the post 39 and into which said one end of the post 39 is extended, the other end of said post 39 abutting against the inner surface of the illustrated top wall of the waveguide 30 through an insulating sheet 36b. The electrodes of the mixer diode 35 are slidably inserted into a concave portion 42 formed at said one end of the post 39 and a through hole 43 formed in the short-circuiting plate 41 of the coaxial line body 40, respectively, which enables the coaxial line body 40 to be axially moved through adjusting the screw engagement between the coaxial line body 40 and the bottom wall of the waveguide 30. The Gunn diode 34 is energized by a bias voltage $V_G$ applied to an input terminal 45 connected to the post 37 through an aperture 44 formed in the top wall of the waveguide. The output from the mixer diode 35 is drawn out from both ends of a load resistor 48 connected between the waveguide wall and an output terminal 47 connected to the post 39 through an aperture 46 formed in the top wall of the waveguide.

The output of this mixer diode is drawn out through a filter 50 as a "Doppler signal" having the difference frequency between the transmitting frequency and the receiving frequency. The transmitting and receiving microwave is shunted by the capacities produced in the interspaces between the waveguide wall and each of the posts 37, 39, said insulating sheets 36a, 36b being provided, respectively, at said interspaces. Accordingly, the microwave does not appear at the output terminal 47. At a prescribed position between the end plate 31 and a straight line connecting the posts 37, 39 an oscillating frequency adjusting screw 49 is fitted by screw engagement to the top wall of the waveguide 30 in a manner penetrating therethrough.

In the microwave transmitting and receiving apparatus having the foregoing construction, the characteristic impedance $Z_0$ and the length $l$ of the coaxial line body 40 are computed from the following equations.

$$Z_0 = \sqrt{R_1 R_2} \sqrt{1 + (X_2^2/R_2 - X_1^2/R_1) / (R_2 - R_1)}$$

$$l = (\lambda/4\pi) (\theta_2 - \theta_1)$$

where $\theta_1 = \tan^{-1}\{-2x_1/(r_1^2 + x_1^2 - 1)\}$, $\theta_2 = \tan^{-1}\{2x_2/(r_2^2 + x_2^2 - 1)\}$, and λ represents a free space wavelength.

Further, when the impedance of the mixer diode 35 is expressed by $Z_1 = R_1 + jX_1$, and the impedance looking into the waveguide from the coaxial line is represented by $Z_2 = R_2 + jX_2$ the following relations are established.

$Z_1/Z_0 = r_1 + jx_1$ $Z_2/Z_0 = r_2 + jx_2$

By providing the coaxial line body 40 set as such it is possible to cause the large impedance $Z_2$ of the waveguide side to readily match with the small impedance $Z_1$ of the mixer diode. When, in the foregoing matching conditions, the respective values of $Z_0$ and $l$ are slightly varied, the connection of the mixer diode with the resonating circuit of the waveguide can be adjusted.

FIGS. 7 and 8 graphically show the variations in the oscillating output $P_0$, receiving sensitivity S, noise level N, S/N ratio and external Q (Qext) relative to the variation in the length $l$ of the coaxial line body of the apparatus illustrated in FIGS. 5 and 6.

Referring to FIG. 7, when the line length $l$ is small, the values of the oscillating output $P_0$ and the external Q (Qext) are both small. This means that the impedances of the Gunn diode and the load circuit are not matched and the oscillation is becoming unstable. Under this condition, therefore, the noise level N is also great in value. Note that the reason why the sensitivity S under this condition is large is that the oscillation is unstable. As the line length $l$ is increased, the external Q becomes larger, so that the oscillation is stabilized. At this time, the noise level N is rapidly decreased, whereas the sensitivity S is only loosely decreased because the oscillating output is increased in level.

The S/N ratio becomes maximum when the length $l$ of the coaxial line body 40 has a value of L in FIG. 7. At this time, the oscillating output Po also becomes maximum, and the Gunn diode and load cicuit are brought to the best matching condition. When the length $l$ is further increased, the load stability is increased since the external Q is increased, but the S/N ratio is decreased since the oscillating output Po is gradually reduced.

FIG. 9 illustrates the relations of the distance R between the detection substance and the microwave transmitting and receiving apparatus with each of the receiving signal S and the residual noise output level N. In FIG. 9, the solid lines indicate the characteristic of the apparatus according to this embodiment, while the broken lines indicate the characteristic of the apparatus according to the first-mentioned embodiment. The curved portions of the illustrated characteristic curve indicate the ranges in which the Doppler signal has a distorted waveform. Accordingly, as apparent from FIG. 9, in case of the apparatus according to this embodiment those portions of the distance R over each of which the waveform distortion takes place respectively have lengths approximately two times those, and the noise level has half the value, in case of the apparatus according to the first-mentioned embodiment.

As above described, since, according to this embodiment, the impedance matching of the mixer diode with the load circuit is almost completely achieved, the apparatus has a high sensitivity. Since, in addition, the external Q is large, the noise component produced from the oscillating element is reduced in amount to increase the S/N ratio. Furthermore, since the characteristic variations of the receiving element and the oscillating element due to the variations in the ambient temperature and load are absorbed in the high Q resonant circuit, the apparatus is made to operate stably. In the apparatus according to the first-mentioned embodiment, the Gunn diode and mixer diode are disposed close to each other on account of its miniaturization, and therefore due to their interaction distortions occur in the output waveform of the Doppler signal, so that this output waveform fails to become a sine waveform. In contrast, in this embodiment, said distortion can be reduced in amount by properly determining the characteristic impedance and the length of the coaxial line body. Further, in the first-mentioned embodiment, the external Q is small, so that it often happens that as the detection substance approaches the apparatus, the curve representing the relation of the receiving signal S with the distance R is moved downward from the illustrated position of 12 dB/oct, or the Doppler signal waveform presents a distortion. But in this embodiment such demerits are decreased to enlarge the operating range of the apparatus.

FIG. 10 illustrates a modification of the apparatus according to the second-mentioned embodiment. In this modified apparatus, the Gunn diode 34 is disposed on the center axis of the waveguide 30, while the mixer diode 35 is disposed between the Gunn diode 34 and the side wall of the waveguide 30.

Further, in this modification, the post 39 may be divided into two parts-upper post and lower post, and the mixer diode 35 may be so provided as to be sandwiched therebetween.

What we claim is:

1. A microwave transmitting and receiving apparatus comprising a rectangular waveguide having one end closed by a short-circuiting plate and having top, bottom and side walls and an oscillating diode and a mixer diode juxtaposed with each other at a position within said waveguide which is spaced from said short-circuiting plate by a distance equal to an integral multiple of half the wavelength of a microwave within said waveguide, said mixer diode being mounted at a position deviated from the center of the top wall (H plane) of said rectangular waveguide toward the side wall (E plane) of said rectangular waveguide.

2. A microwave transmitting and receiving apparatus according to claim 1, wherein said oscillating diode is disposed at a position opposite to that at which said mixer diode is disposed, with respect to the center of said top wall ($H$ plane) of said waveguide.

3. A microwave transmitting and receiving apparatus according to claim 1, wherein said oscillating diode is disposed at the center of said top wall (H plane) of said waveguide.

4. A mmicrowave transmitting and receiving apparatus according to claim 1, wherein a pair of posts are disposed within said waveguide, and said oscillating diode and said mixer diode are connected, respectively, to said pair of posts.

5. A microwave transmitting and receiving apparatus according to claim 1, which further comprises a first adjusting screw fitted by screw engagement to either one of said top and bottom walls of said waveguide at a prescribed position between said short-circuiting plate of said waveguide and a straight line connecting said oscillating diode and mixer diode in a manner penetrating through said either one wall, and a second adjusting screw fitted by screw engagement to said either one wall at that position thereof which is spaced by a distance of ¼ λg from said connection line in a direction opposite to that directed toward said short-circuiting plate.

6. A microwave transmitting and receiving apparatus comprising a rectangular waveguide having one end closed by a short-circuiting plate and having top and bottom walls large in width and side walls small in width, an oscillating diode disposed at that position within said waveguide which is spaced from said short-circuiting plate by a distance equal to an integral multiple of half the wavelength of a microwave within said waveguide, a coaxial line body outwardly projectively provided at that position (H plane) of said waveguide which is situated laterally of said oscillating diode and spaced by said distance from said short-circuiting plate, and a mixer diode disposed within said coaxial line body.

7. A microwave transmitting and receiving apparatus according to claim 6, wherein said oscillating diode and said mixer diode are disposed at positions within said waveguide which are equidistant from the center of said top wall (H plane) of said waveguide.

8. A microwave transmitting and receiving apparatus according to claim 6, wherein said oscillating diode is disposed at the center of said top wall (H plane) of said waveguide.

9. A microwave transmitting and receiving apparatus according to claim 6, which further comprises a first conductive post having one end allowed to abut against the inner surface of said top wall of said waveguide through a first insulating sheet and the other end connected to said oscillating diode and a second conductive post having one end allowed to abut against the inner surface of said top wall of said waveguide through a second insulating sheet and the other end connected to said mixer diode.

10. A microwave transmitting and receiving apparatus according to claim 9, wherein said top wall of said waveguide is formed with two through holes for outgoing lines being connected to said first and second posts at positions corresponding, respectively, to said first and second posts.

11. A microwave transmitting and receiving apparatus according to claim 6, wherein an adjusting screw is fitted by screw engagement to said top wall at a prescribed position between said short-circuiting plate of said waveguide and a straight line connecting said oscillating diode and said mixer diode, in a manner penetrating through said top wall.

* * * * *

UNITED STATES PATENT AND TRADEMARK OFFICE
CERTIFICATE OF CORRECTION

PATENT NO. : 3,980,974
DATED : September 14, 1976
INVENTOR(S) : Sadamu Yamamoto et al It is certified that error appears in the above–identified patent and that said Letters Patent are hereby corrected as shown below:

Please correct the Foreign Application Priority Data section to read as follows:

--[30]   Foreign Application Priority Data

April 1, 1974 Japan .................... 35616/74
October 28, 1974 Japan ................ 123470/74--

Signed and Sealed this

Fourteenth Day of December 1976

[SEAL]

Attest:

RUTH C. MASON
*Attesting Officer*

C. MARSHALL DANN
*Commissioner of Patents and Trademarks*